(12) United States Patent
Devins et al.

(10) Patent No.: US 7,451,070 B2
(45) Date of Patent: Nov. 11, 2008

(54) OPTIMAL BUS OPERATION PERFORMANCE IN A LOGIC SIMULATION ENVIRONMENT

(75) Inventors: Robert J. Devins, Essex Junction, VT (US); David W. Milton, Underhill, VT (US)

(73) Assignee: International Business Machines, Armonk, NY (US)

( * ) Notice: Subject to any disclaimer, the term of this patent is extended or adjusted under 35 U.S.C. 154(b) by 559 days.

(21) Appl. No.: 10/907,628

(22) Filed: Apr. 8, 2005

(65) Prior Publication Data
US 2006/0229858 A1   Oct. 12, 2006

(51) Int. Cl.
*G06F 9/455* (2006.01)

(52) U.S. Cl. .............................. 703/14; 703/13; 703/28; 710/58

(58) Field of Classification Search ............. 703/13–15, 703/28; 704/200.1, 500; 709/235; 710/58
See application file for complete search history.

(56) References Cited

U.S. PATENT DOCUMENTS

| | | | |
|---|---|---|---|
| 6,470,478 B1 | 10/2002 | Bargh et al. | 716/4 |
| 6,571,373 B1 | 5/2003 | Devins et al. | 716/5 |
| 6,678,625 B1 | 1/2004 | Reise et al. | 702/117 |
| 6,760,888 B2 | 7/2004 | Killian et al. | 716/1 |
| 6,952,677 B1 * | 10/2005 | Absar et al. | 704/500 |
| 7,003,449 B1 * | 2/2006 | Absar et al. | 704/200.1 |
| 2003/0131325 A1 | 7/2003 | Schubert et al. | 716/4 |
| 2003/0145290 A1 | 7/2003 | Devins et al. | 716/4 |

OTHER PUBLICATIONS

Blaner et al. "An Embedded PowerPC™ SOC for Test and Measurement Applications." 13th IEEE Int'l ASIC/SOC Conf. pp. 204-208, Sep. 13-16, 2000.*
Milton et al., "Behavioral Synthesis Utilizing Dynamic Memory Constructs." IEE Proc. Computers and Digital Techniques. vol. 151, Issue 3, pp. 252-264. May 19, 2004.*

* cited by examiner

*Primary Examiner*—Zoila E. Cabrera
*Assistant Examiner*—Jason Proctor
(74) *Attorney, Agent, or Firm*—Shelley M Beckstrand; Ryan K. Simmons

(57) ABSTRACT

Sample-count feedback from bus functional models and a binary convergence algorithm are to generate optimal sampling values for an accelerator, or hardware assisted simulator. The simulator includes a bus functional model and a driver program. A software readable register maintains a count of a number of samples provided the simulator in execution of a transaction on the bus functional model. For each supported bus functional model, a sample count retrieved from the bus functional model and a last sampling value given the hardware assisted simulator is maintained, and a binary convergence algorithm applied to generate sampling values based on the last sampling value given to the hardware assisted simulator and the last actual sampling value used by a given bus functional model for a transaction.

3 Claims, 4 Drawing Sheets

PLB     PROCESSOR LOCAL BUS
DCR    DEVICE CONTROL REGISTER
UIC     UNIVERSAL INTERRUPT CONTROLLER
CPU    CENTRAL PROCESSING UNIT

OPTIMAL BUS OPERATION PERFORMANCE IN A LOGIC SIMULATION ENVIRONMENT

BACKGROUND OF THE INVENTION

1. Technical Field of the Invention

This invention relates to the testing of computer system designs by software simulation facilitated by a physical simulation machine, or accelerator, and more particularly to applying a binary convergence algorithm to generate sampling values to optimize accelerator cycles.

2. Background Art

The complexity and sophistication of present-day integrated circuit (IC) chips have advanced significantly over those of early chip designs. Where formerly a chip might embody relatively simple electronic logic blocks effected by interconnections between logic gates, currently chips can include combinations of complex, modularized IC designs often called "cores" which together constitute an entire "system-on-a-chip", or SOC.

In general, IC chip development includes a design phase and a verification phase for determining whether a design works as expected. The verification phase has moved increasingly toward a software simulation approach to avoid the costs of first implementing designs in hardware to verify them.

A key factor for developers and marketers of IC chips in being competitive in business is time-to-market of new products; the shorter the time-to-market, the better the prospects for sales. Time-to-market in turn depends to a significant on the duration of the verification phase for new products to be released.

As chip designs have become more complex, shortcomings in existing chip verification methodologies which extend time-to-market have become evident.

Typically, in verifying a design, a simulator is used. Here, "simulator" refers to specialized software whose functions include accepting software written in a hardware description language (HDL) such as Verilog or VHDL, which models a circuit design (for example, a core as described above), and using the model to simulate the response of the design to stimuli which are applied by a test case to determine whether the design functions as expected. The results are observed and used to de-bug the design.

In order to achieve acceptably bug-free designs, verification software must be developed for applying a number of test cases sufficient to fully exercise the design in simulation. In the case of System-on-chip (SOC) designs, the functioning of both the individual cores as they are developed, and of the cores interconnected as a system must be verified.

Hardware assisted simulation (or acceleration) has the potential of providing a very high performance environment for digital logic simulation.

As opposed to a pure software simulator, an accelerator consists of a specialized physical simulation machine (the accelerator), connected by cable to a port on a physical host computer. The digital logic being simulated is synthesized and loaded into the machine, and a software device driver in the host computer interacts with the machine.

Test cases for the system, in the context of this invention, consist of sequences of bus transactions that originate in software application code, such as the IBM Test Operating System or other firmware applications, and are driven into the accelerator.

Within the logic of the loaded design, are a set of Bus Functional Models (BFMs) that contain interface registers for driving the transactions. Each BFM supports a specific type of transaction such as Device Control Register (DCR) or Processor Local Bus (PLB) reads, or PLB writes, for example.

Driving transactions means reading and writing BFM registers values in the logic hierarchy of the loaded design, thru the device driver, and programming the accelerator to run a certain number of samples to execute the desired transaction.

The accelerator's performance is maximized when it has lots of samples to directly execute, with minimum interaction with the host computer. The test application software runs at a much higher speed than the accelerator. Overall system thruput is therefore determined by the performance of the accelerator, and the rate that the software can deliver transactions, and is maximized by the correct balance of the two.

A test case consists of a sequence of transactions, different types of reads and writes, issued to multiple BFMs in the design. The actual number of samples it takes to complete a transaction varies according to BFM type and design element interactions. An automated method of optimized balance between the number of samples given to the accelerator and the workload (sequence of transactions) is needed. The method needs to be ambivalent to the actual logic design being simulated, and the dynamic interactions within the design. Current art uses worst case sampling, or empirically determined sampling values (based on design specifications). This approach can either starve the test application (by over-sampling the accelerator), or cause too much host computer interaction (by under-sampling the accelerator). In either case, overall thruput is compromised.

SUMMARY OF THE INVENTION

A system, method, and computer program product for running samples in a hardware assisted simulator containing a bus functional model, by counting on a software readable register a number of samples provided the hardware assisted simulator in execution of a transaction on the bus functional model; storing for each supported bus functional model variables, including a sample count retrieved from the bus functional model and a last sampling value given the hardware assisted simulator; applying a binary convergence algorithm to generate new sampling values based on the last sampling value given to the hardware assisted simulator and the last actual sampling value used by a given BFM for a transaction; maintaining a DOIT flag as a single bit hardware register set to start a current transaction and reset to signal completion of said current transactions; maintaining a counter for accumulating the actual sampling values; responsive to receiving a new transaction from a test program for execution, fetching a value F from the counter as the last actual sampling value; executing the binary convergence algorithm on the value F to calculate a value Snew as the new sampling value; initializing for the current transaction a command register specifying a transaction for execution; resetting the counter, setting the DOIT flag, sampling the simulator Snew times, for each of the sampling incrementing the counter and registering results, then disabling the counter, resetting the DOIT flag; and responsive to the DOIT flag being reset, fetching the results to the test program.

DETAILED DESCRIPTION OF PREFERRED EMBODIMENTS

This invention provides a system and method using sample-count feedback from the BFMs along with a binary convergence algorithm to generate optimal sampling values. The preferred embodiments of the invention automatically take into account dynamic interactions in the design, and is not tied to a given design point.

Figure 1:
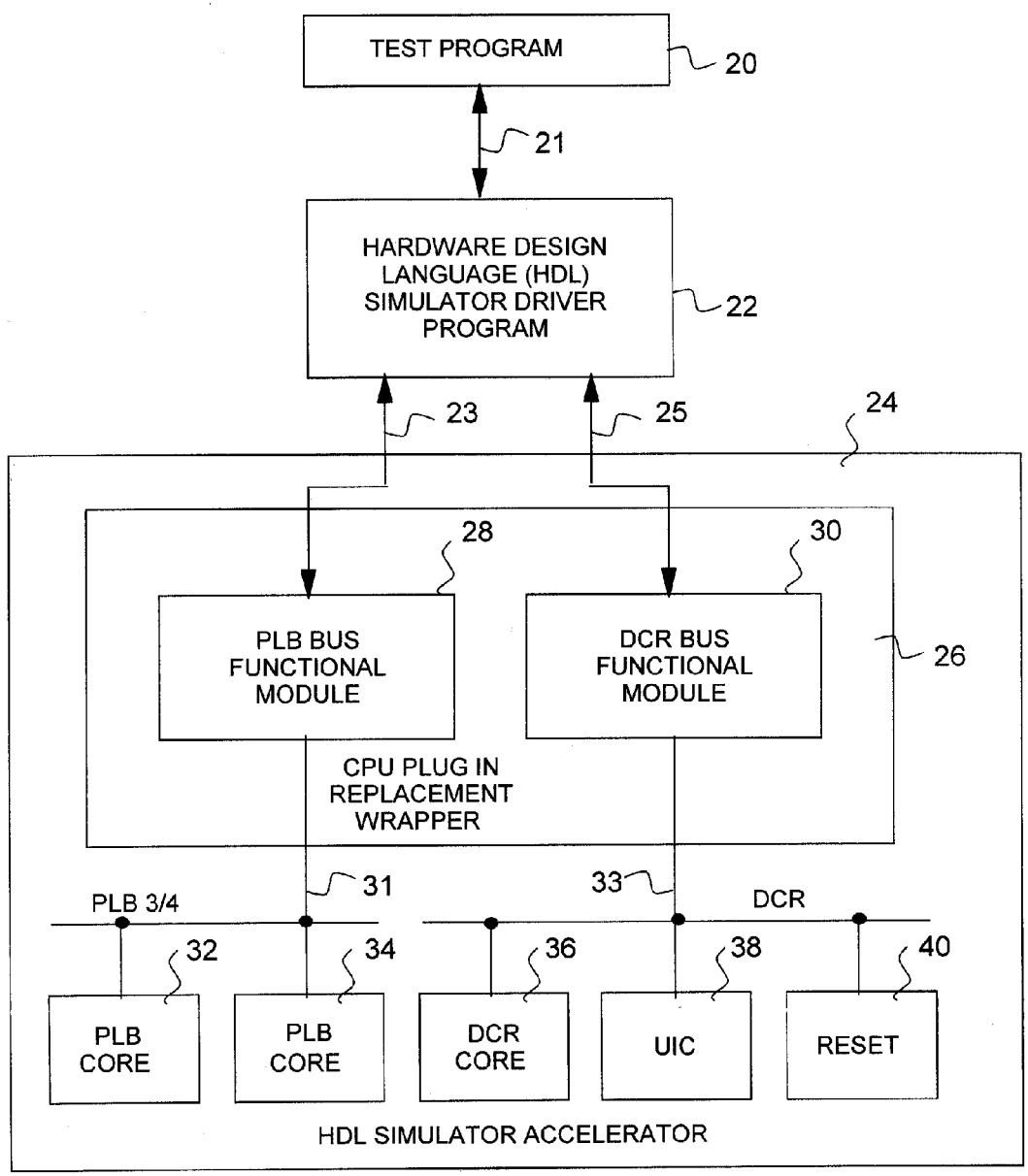
FIG. 1 is a high level system diagram illustrating the system of the invention.

Referring to FIG. 1, the system of the invention includes a test case program 20, a hardware design language (HDL) simulator driver program 22. As is represented by lines 23, 25, driver program 22 access Processor Local Bus (PLB) bus functional model 28 and Device Control Register (DCR) bus functional model 30 within CPU plug-in replacement wrapper 26. PLB version 3 and/or version 4 bus 31 connects PLB bus functional model 28 to PLB cores 32, 34, and DCR bus 33 connects DCR bus functional model to DCR core 36, Universal Interrupt Controller (UIC) 38, and reset 40. A bus is a communication pathway implying a number wires and a protocol. The PLB bus is the bus the processor connects to, and the DCR is a bus protocol implemented within a chip. A PLB core is a device, such as a CPU, DMA, or memory controller, which communicates with other devices using the PLB. A DCR core is a device which communicates with other devices over the DCR bus. The UIC queues up interrupts and interrupt vectors for the processor. A plugin replacement wrapper (in the context of the CPU) is a model for the CPU that does not model everything the CPU does, but a sufficient subset for purpose of the present invention. That subset includes modeling the activity of CPU performs on the PLB and DCR, the Interrupt and reset behavior, and requires the clocks that the CPU requires.

Figure 2:
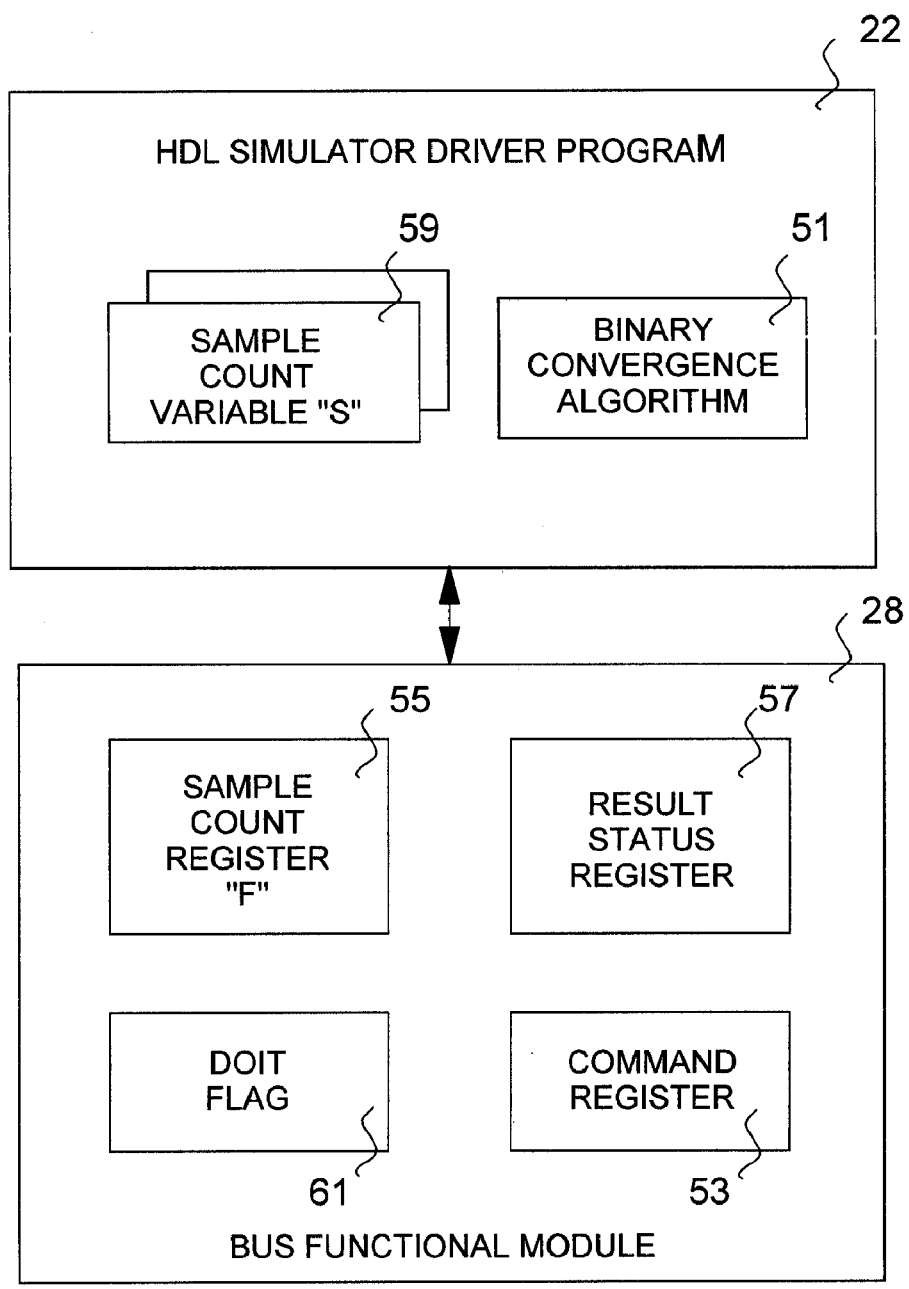
FIG. 2 is a diagrammatic representation of selected variables and registers of the HDL simulator driver and bus functional model of FIG. 1.
Figure 3:
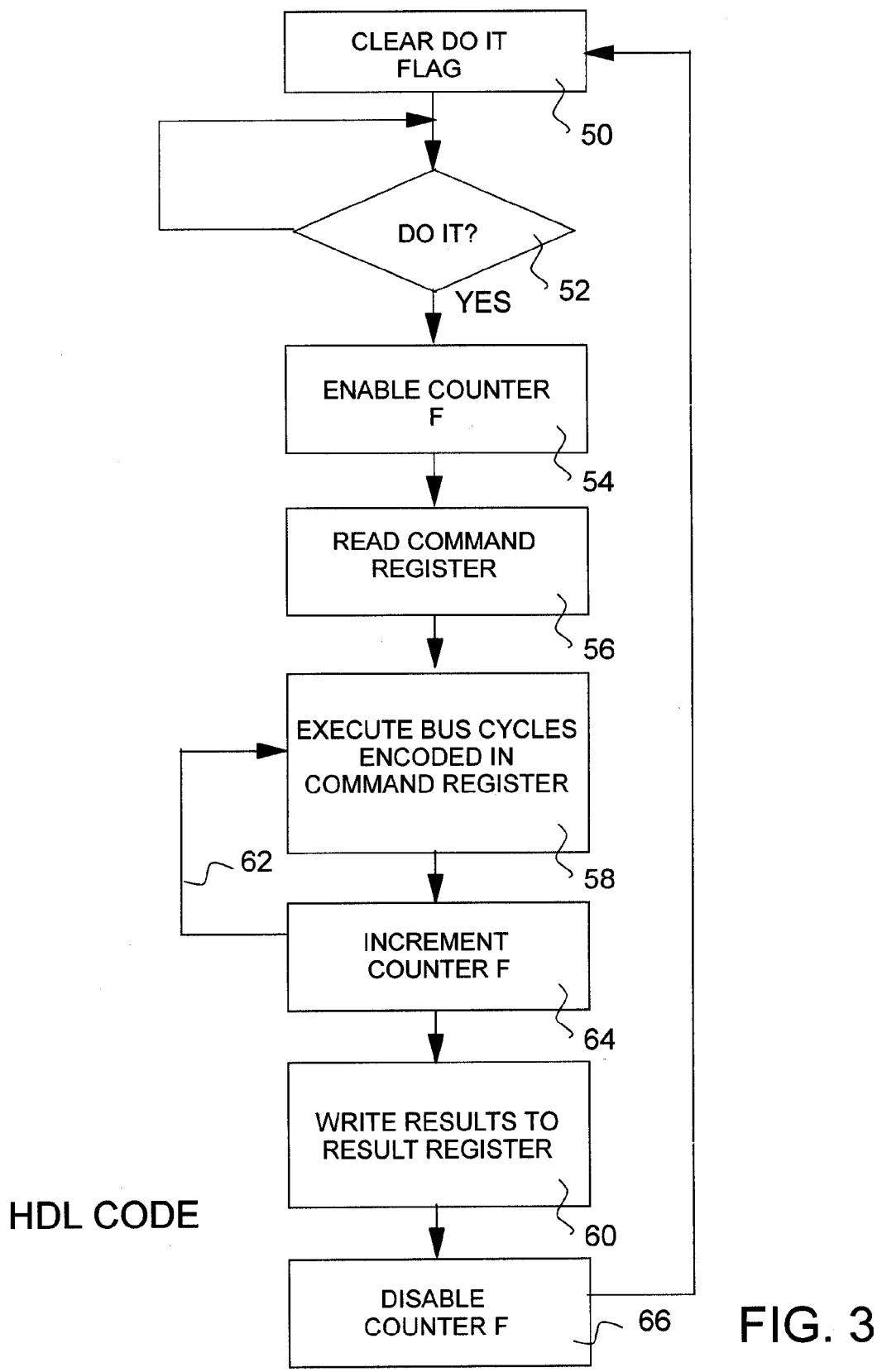
FIG. 3 a flowchart representing the process implemented by the HDL code of the HDL simulator driver program of FIG. 1.
Figure 4:
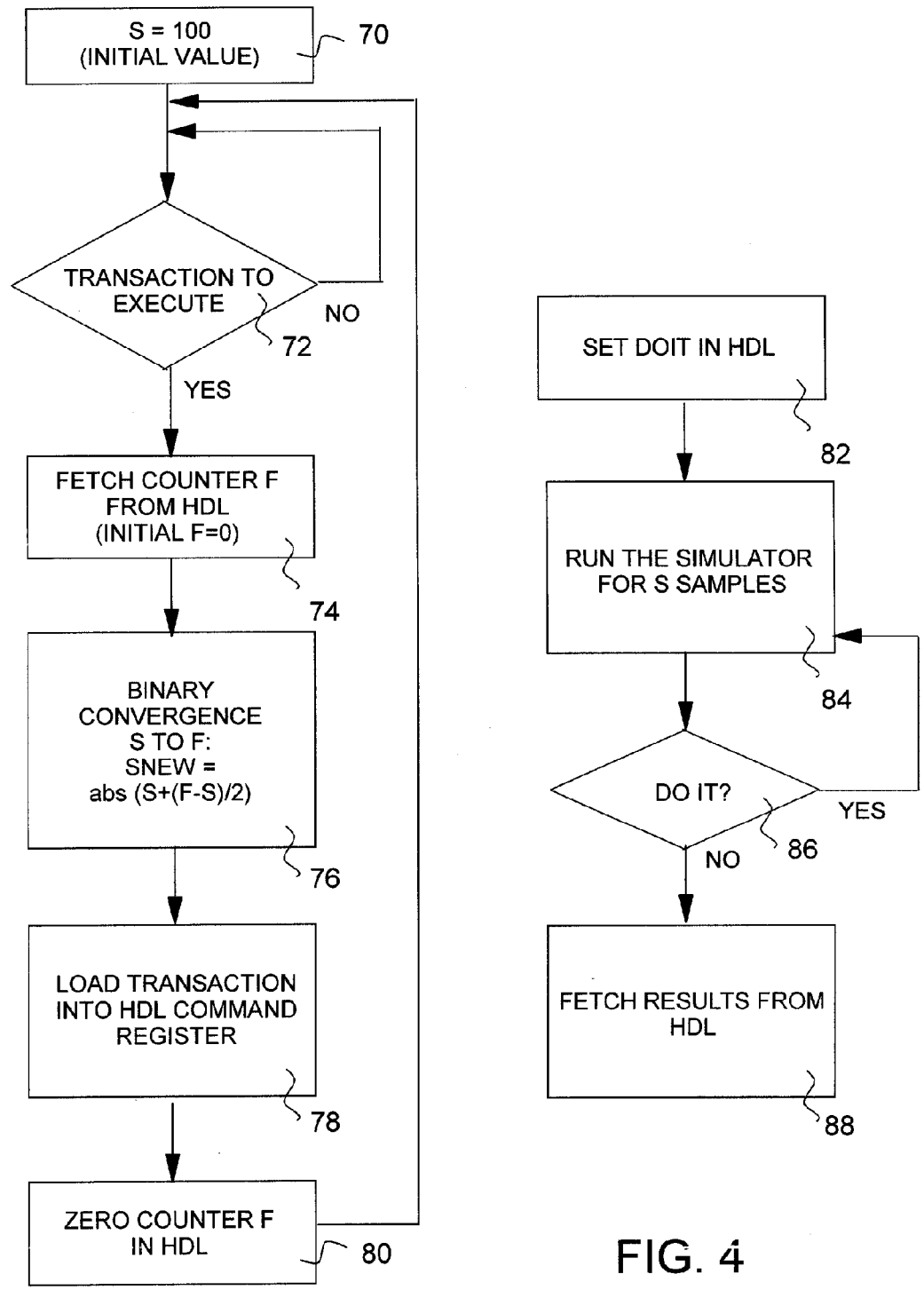
FIG. 4 is a flowchart representing the process implemented by the C code of the HDL simulator driver program of FIG. 1.

HDL simulator driver program 32 interfaces with HDL bus functional models (BFM) 28, 30 to drive transactions, and samples HDL simulator 24, as will more fully described hereafter in connection with FIGS. 2-4.

Referring to FIG. 2, in accordance with a preferred embodiment of the invention, HDL simulator driver program 22 and a typical bus functional model 28 are illustrated. Each BFM 28 contains a software readable register 55 that counts the total number of samples used in execution of a transaction on BFM 28. Register 55 is reset to zero at the start of each transaction.

Each BFM 28 contains a status (DOIT) flag 61 that indicates that a transaction is complete, with results set in result/status register 57.

Test application software library 22, also referred to as HDL simulator driver program 22, contains a variable 59, for each supported BFM 28, 30, that contains the sample count retrieved from respective BFM sample count registers 55. This allows comparison to a next BFM sample count.

HDL simulator driver program, or software, 22 contains a binary convergence algorithm 51 to generate sampling values based on the last sampling value given to the accelerator, and the last actual sampling value used by a given BFM 28 for a given transaction.

Convergence algorithm 51 executes the following calculation: calculate sampling value for the upcoming transaction (F and S are signed integers):

a. S=last sampling value given to accelerator, for this type of transaction (on a particular BFM). This is variable 59 of FIG. 2.
  b. F=feedback value from BFM (how long, that is, how many samples, the last transaction actually took) for this type of transaction. This value F is the current count in register 55 of FIG. 2, the initial value of which is zero.
  c. new sampling value: $S=abs(S+(F-S)/2)$. (Binary convergence)
  d. load the transaction into the BFM 28 command register 53, then sample simulator 24 S times. This variable "S" is the value in variable 59.

Sampling calculation 51 quickly converges on the BFM feedback values 55, especially when sequential transactions are of the same type (using the same BFM 28). The chances are (due to probabilities of software execution) that this is true. Bus-loading dynamics within the design may produce various feedback values 57, and the above calculations of algorithm 51 will produce S-values that reflect these changes. When a transaction of a different type is introduced, all variables 59 and optimizations 51 apply to the specific transaction type requested. The algorithm 51 reduces accelerator 24 over sampling and under sampling, and relies on sequential transaction probability to create the optimizations on the S-values 59.

Referring to FIGS. 3 and 4, in an exemplary embodiment, HDL simulator driver program includes HDL code and C code.

In broad overview, HDL code remembers how many cycles it took to do the last instance of a give operation, and C code remembers the last sampling value (on cycles) given to the HDL code. A binary convergence algorithm takes these as inputs and converges on the optimum number of cycles by taking the average of times given and taken. Once optimized, test operations continue testing bus traffic until something changes, and then the optimization process is repeated. Bus loading dynamics measure how long it takes to do any given operation. The binary convergence algorithm is built on the observation that there is a significant positive probability that a given operation on a bus will take substantially the same amount of time in successive instances.

Referring to FIG. 3, HDL code executes as follows. In step 52, the state of DOIT flag 61 is checked. DOIT flag 61 is a single bit hardware register written by both the software side 22 and the hardware HDL BFM side 28. When written to 1 (set) by software 22, it is a request to start a transaction. When written to 0 (reset) by HDL BFM 28, it signals transaction complete.

In step 54, counter F 55 is enabled, and in step 56 command register 53 is read.

In step 58, the bus cycles encoded in command register 53 are executed. Previously, software 22 has written to command register 53 to specify what kind of transaction (read/write) to execute.

In step 64, counter F 55 is incremented for this cycle through steps 58-64 and, as is represented by line 62, the cycle repeats until a given HDL transaction completes. Upon completion of the cycle, in step 60, results, including status and return data from a transaction, are written to result/status register 57, and in step 66 counter F 55 is disabled (it now contains a count of the number of cycles taken for this given HDL transaction to complete). In step 50 DOIT flag 61 is cleared, and processing proceeds to step 52 where it waits for DOIT flag to be set to start a new transaction.

Referring to FIG. 4, software (C) code executes as follows. Sample count variable 'S' 59 is a 'C' variable in interface program 22. In step 70, it is arbitrarily initialized to a value, such as 100. In step 72, the software waits for a transaction to execute. Transactions originate from a calling test case program 20, and transaction results, including results 57, are returned to test case program 20.

In step 74, upon determining that a transaction is to be executed in step 72, software fetches counter F 55 from HDL BFM 28 as input to execution in step 76 of binary convergence algorithm 51.

In step 78, this transaction is loaded into HDL BFM command register 53. In step 80, sample count register F 55 is reset to null to condition it for counting cycles through step 58 (FIG. 3) for this transaction.

In step 82, DOIT flag 61 is set to 1 by software 22, and in step 84 simulator 24 is sampled S times (that is, the simulator is run for S samples, where the value S is variable 59 following execution in step 76 of the binary convergence value at the beginning of this transaction), whereupon DOIT flag is reset to 0 by BFM 28 to signal completion of this transaction. In step 88, the results of this transaction are fetched from result/status register 57 and returned to test program 20 for further analysis.

Advantages Over the Prior Art

It is an advantage of the invention that there is provided an improved system, method, and program storage device for testing of computer system designs.

Alternative Embodiments

Figure 5:
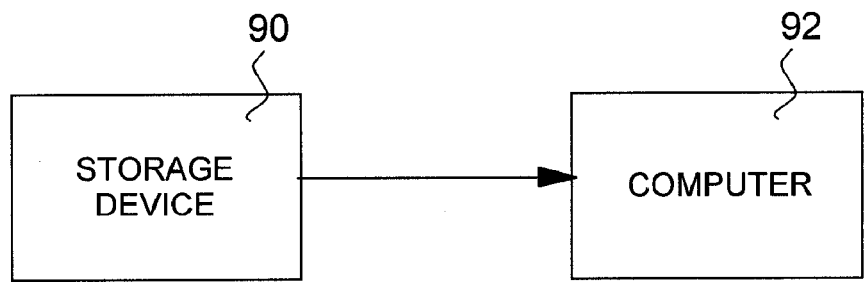
FIG. 5 is a high level system diagram illustrating a program storage device readable by a computer for executing the process of the invention.

It will be appreciated that, although specific embodiments of the invention have been described herein for purposes of illustration, various modifications may be made without departing from the spirit and scope of the invention. Referring to FIG. 5, in particular, it is within the scope of the invention to provide storage device for storing a computer program product or program element, or a program storage or memory device such as a solid or fluid transmission medium, magnetic or optical wire, tape or disc, or the like, 90 for storing signals readable by a machine, for controlling the operation of a computer 92 according to the method of the invention and/or to structure its components in accordance with the system of the invention.

Further, each step of the method may be executed on any general computer, such as IBM Systems designated as zSeries, iSeries, xSeries, and pSeries, or the like and pursuant to one or more, or a part of one or more, program elements, models or objects generated from any programming language, such as C++, Java, Pl/1, Fortran or the like. And still further, each said step, or a file or object or the like implementing each said step, may be executed by special purpose hardware or a circuit module designed for that purpose.

Accordingly, the scope of protection of this invention is limited only by the following claims and their equivalents.

What is claimed is:

1. A method for running samples in a hardware assisted simulator including a bus functional model, comprising the steps of:

counting on a software readable register a number of samples provided to said hardware assisted simulator in execution of a transaction on said bus functional model;

storing for said bus functional model variables including a sample count retrieved from said bus functional model and a last actual sampling value given said hardware assisted simulator;

applying a binary convergence algorithm to generate new sampling values based on said last sampling value given to said hardware assisted simulator and said last actual sampling value used by a given bus functional model for a transaction;

maintaining a DOIT flag as a single bit hardware register set to start a current transaction and reset to signal completion of said current transaction;

maintaining a counter for accumulating said actual sampling values;

responsive to receiving a new transaction from a test program for execution, fetching a value F from said counter as said last actual sampling value;

executing said binary convergence algorithm on said value F to calculate a value Snew as said new sampling value;

initializing for said current transaction a command register specifying a transaction for execution;

resetting said counter, setting said DOIT flag, sampling said simulator Snew times, for each said sampling incrementing said counter and registering results, then disabling said counter, resetting said DOIT flag; and responsive to said DOIT flag being reset, fetching said results to said test program.

2. A system for running samples in a hardware assisted simulator including a bus functional model, comprising:

a software readable register for counting a number of samples provided to said hardware assisted simulator in execution of a transaction on said bus functional model;

a store for storing for said bus functional model variables including a sample count variable retrieved from said bus functional model and a last actual sampling value given to said hardware assisted simulator;

a logic unit for applying a binary convergence algorithm to generate new sampling values based on said last sampling value given to said hardware assisted simulator and said last actual sampling value used by a given bus functional model for a transaction;

a simulator driver program module including said sample count variable and said logic unit;

at least one bus functional model including said software readable register, a DOIT flag, a result/status register, and a command register;

said DOIT flag implemented as a single bit hardware register which is set to start a current transaction and reset to signal completion of said current transaction;

said software readable register for accumulating said actual sampling values;

said logic unit, responsive to receiving a new transaction from a test program for execution, for fetching a value F from said software readable register as said last actual sampling value;

said logic unit further for executing said binary convergence algorithm on said value F to calculate a value Snew as said new sampling value;

said command register initialized for said current transaction for specifying a transaction for execution;

said bus functional model for resetting said first counter, setting said DOIT flag, sampling said simulator Snew times, for each said sampling incrementing said first counter and registering results, then disabling said first counter and resetting said DOIT flag; and said program module, responsive to said DOIT flag being reset, for fetching said results to said test program.

3. A computer program product for running samples in a hardware assisted simulator including a bus functional model, said computer program product comprising:
- a computer readable storage medium;
- first program instructions to count on a software readable register a number of samples provided to said hardware assisted simulator in execution of a transaction on said bus functional model;
- second program instructions to store for said bus functional model variables including a sample count retrieved from said bus functional model and a last actual sampling value given said hardware assisted simulator;
- third program instructions to apply a binary convergence algorithm to generate new sampling values based on said last sampling value given to said hardware assisted simulator and said last actual sampling value used by a given bus functional model for a transaction;
- fourth program instructions to maintain a DOIT flag as a single bit hardware register which is set to start a current transaction and which is reset to signal completion of said current transaction;
- fifth program instructions to maintain a first counter for accumulating said actual sampling values;
- sixth program instructions, responsive to receiving a new transaction from a test program for execution, to fetch a value F from said first counter as said last actual sampling value;
- seventh program instructions to execute said binary convergence algorithm on said value F to calculate a value Snew as said new sampling value;
- eighth program instructions to initialize for said current transaction a command register specifying a transaction for execution;
- ninth program instructions to reset said first counter, set said DOIT flag, sample said simulator Snew times, for each said sample increment said first counter and register results, then disable said first counter, and reset said DOIT flag; and
- tenth program instructions, responsive to said DOIT flag being reset, to fetch said results to said test program; and wherein
- said first, second, third, fourth, fifth, sixth, seventh, eighth, ninth, and tenth program instructions are recorded on said storage medium.

* * * * *